United States Patent
Hoffmeyer et al.

(10) Patent No.: US 10,653,037 B2
(45) Date of Patent: May 12, 2020

(54) THERMAL INTERFACE MATERIAL STRUCTURES

(71) Applicant: International Business Machines Corporation, Armonk, NY (US)

(72) Inventors: Mark K. Hoffmeyer, Rochester, MN (US); Phillip V. Mann, Rochester, MN (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/210,592

(22) Filed: Dec. 5, 2018

(65) Prior Publication Data
US 2019/0116686 A1 Apr. 18, 2019

Related U.S. Application Data

(62) Division of application No. 15/193,186, filed on Jun. 27, 2016, now Pat. No. 10,182,514.

(51) Int. Cl.
*H05K 7/20* (2006.01)
*H01L 23/373* (2006.01)
(Continued)

(52) U.S. Cl.
CPC ............ *H05K 7/2039* (2013.01); *G06F 1/20* (2013.01); *H01L 23/373* (2013.01); *H01L 23/3737* (2013.01); *H01L 23/42* (2013.01)

(58) Field of Classification Search
CPC ........... H05K 7/20409; H05K 7/20436; H05K 9/0081; H05K 1/0215; H05K 7/20418;
(Continued)

(56) References Cited

U.S. PATENT DOCUMENTS 6,372,997 B1   4/2002   Hill et al.
7,031,162 B2 *  4/2006   Arvelo .................. H01L 23/433
                                                  361/718
(Continued)

FOREIGN PATENT DOCUMENTS

CN    102956584 A    3/2013
CN    203675528 U    6/2014
(Continued)

OTHER PUBLICATIONS

Abawi, *The Bending of Bonded Layers Due to Thermal Stress*, Hughes Research Labs Internal Memorandum, Oct. 23, 2004, 11 pages, Heat, Light & Sound Research, Inc. (hlsresearch.com) online, URL: http://hlsresearch.com/personnel/abawi/papers/bend.pdf.
(Continued)

*Primary Examiner* — Adam B Dravininkas
(74) *Attorney, Agent, or Firm* — Nathan M. Rau

(57) ABSTRACT

In an example, a thermal interface material (TIM) structure is disclosed. The TIM structure includes a first thermal interface material layer comprising a gap filler material and a second thermal interface material layer comprising a solid thermal pad. The TIM structure has one or more overlapping regions associated with partial overlap of a surface of the gap filler material by the solid thermal pad such that a portion of the surface is exposed.

13 Claims, 9 Drawing Sheets

(51) Int. Cl.
*H01L 23/42* (2006.01)
*G06F 1/20* (2006.01)

(58) Field of Classification Search
CPC ......... H05K 1/141; H05K 2201/10446; H05K 9/0007; H05K 13/00; H05K 2201/09081; H05K 2201/10386; H05K 5/0217; H05K 9/0047; H05K 9/0079; H05K 1/0203; H05K 7/2039; H05K 2201/10106; H05K 7/20254; H05K 7/20772; H05K 7/20781; H05K 9/0032; H05K 1/0204; H05K 3/0061; H05K 7/20445; H05K 1/021; H05K 7/20263; H05K 2201/066; H05K 7/20; H05K 7/20336; H05K 7/20509; H05K 7/20763; H05K 7/205; G06F 1/20; G06F 1/203
See application file for complete search history.

(56) References Cited

U.S. PATENT DOCUMENTS

| | | | |
|---|---|---|---|
| 7,875,972 B2 * | 1/2011 | Jadhav | H01L 23/3735 257/712 |
| 8,693,200 B2 | 4/2014 | Colgan et al. | |
| 9,017,808 B2 | 4/2015 | Wang et al. | |
| 9,179,579 B2 | 11/2015 | Hada et al. | |
| 9,609,744 B2 | 3/2017 | Hoffmeyer et al. | |
| 2003/0160319 A1 | 8/2003 | Zheng et al. | |
| 2004/0020634 A1 * | 2/2004 | Boudreaux | F28F 13/00 165/104.33 |
| 2004/0042178 A1 * | 3/2004 | Gektin | H01L 23/42 361/705 |
| 2004/0124526 A1 * | 7/2004 | Matayabas, Jr. | H01L 23/3737 257/712 |
| 2006/0238984 A1 * | 10/2006 | Belady | H01L 23/367 361/704 |
| 2010/0129648 A1 | 5/2010 | Xu et al. | |
| 2010/0187680 A1 | 7/2010 | Otsuka et al. | |
| 2013/0160983 A1 | 6/2013 | Zhang et al. | |
| 2013/0199752 A1 | 8/2013 | Colgan et al. | |
| 2013/0265722 A1 | 10/2013 | Hill et al. | |
| 2013/0308274 A1 | 11/2013 | Murdock et al. | |
| 2013/0329352 A1 | 12/2013 | Nigen et al. | |
| 2014/0070393 A1 | 3/2014 | Bartley et al. | |
| 2014/0264799 A1 * | 9/2014 | Gowda | H01L 23/3677 257/675 |
| 2014/0328024 A1 | 11/2014 | Mataya et al. | |
| 2015/0208550 A1 | 7/2015 | Rugg | |
| 2015/0305189 A1 | 10/2015 | Strader et al. | |
| 2015/0334871 A1 | 11/2015 | Hill et al. | |
| 2016/0021788 A1 * | 1/2016 | Chauhan | B23P 15/26 361/706 |
| 2016/0315030 A1 * | 10/2016 | Strader | H01L 23/3737 |
| 2017/0374759 A1 | 12/2017 | Hoffmeyer et al. | |
| 2018/0203495 A1 * | 7/2018 | Campbell | G06F 1/266 |
| 2018/0203496 A1 * | 7/2018 | Campbell | H01L 23/34 |

FOREIGN PATENT DOCUMENTS

| | | |
|---|---|---|
| CN | 105611812 A | 5/2016 |
| CN | 106067452 A | 11/2016 |
| TW | 2006/37475 A | 10/2006 |
| WO | WO-2015/120773 A1 | 8/2015 |
| WO | WO-2018/002754 A1 | 1/2018 |

OTHER PUBLICATIONS

AUS920160293US02, Appendix P; List of IBM Patent or Application Treated as Related, Dec. 5, 2018, 2 pages.
International Search Report and Written Opinion, PCT/IB2017/053491, dated Sep. 27, 2017, 9 pages.

* cited by examiner

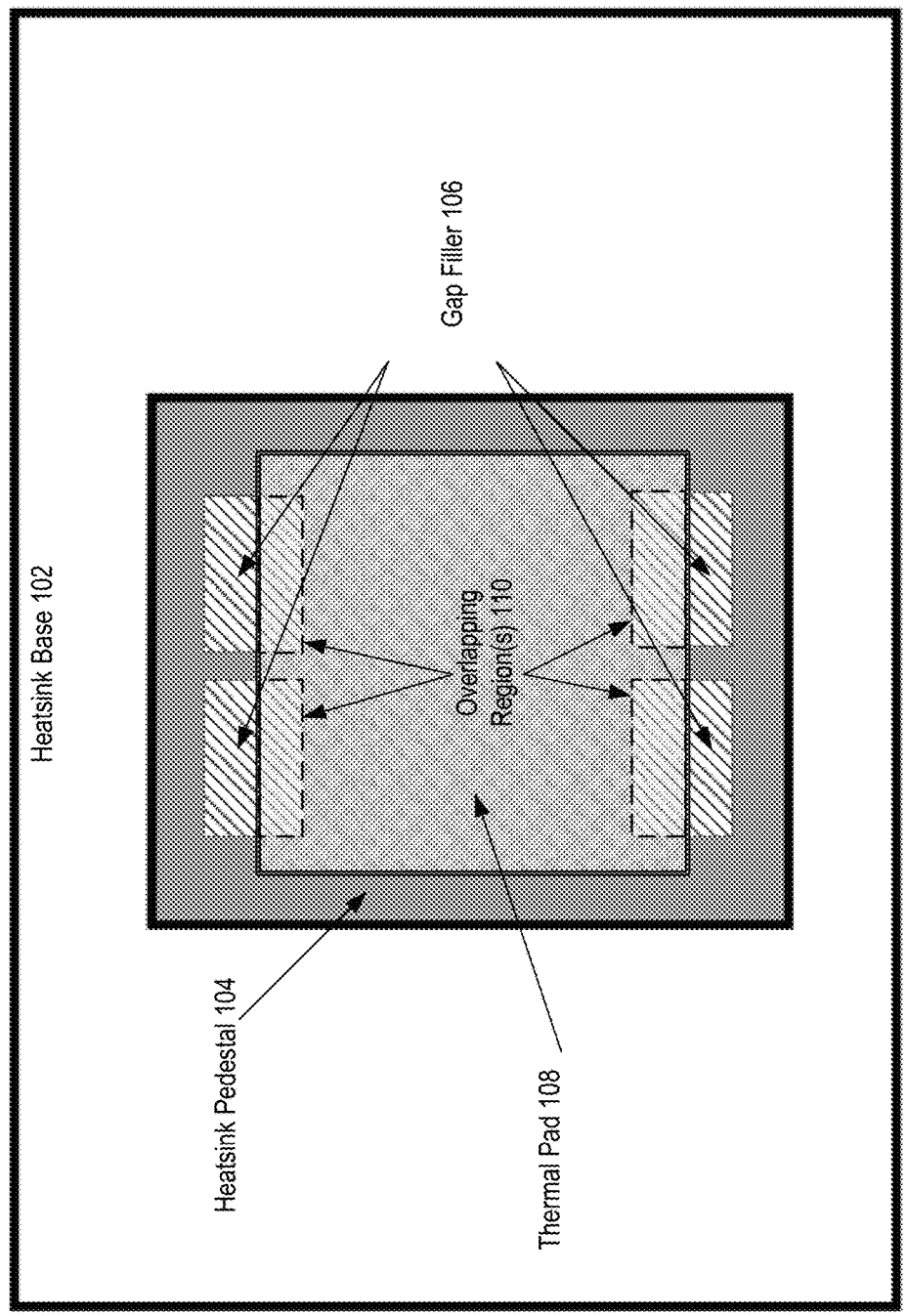

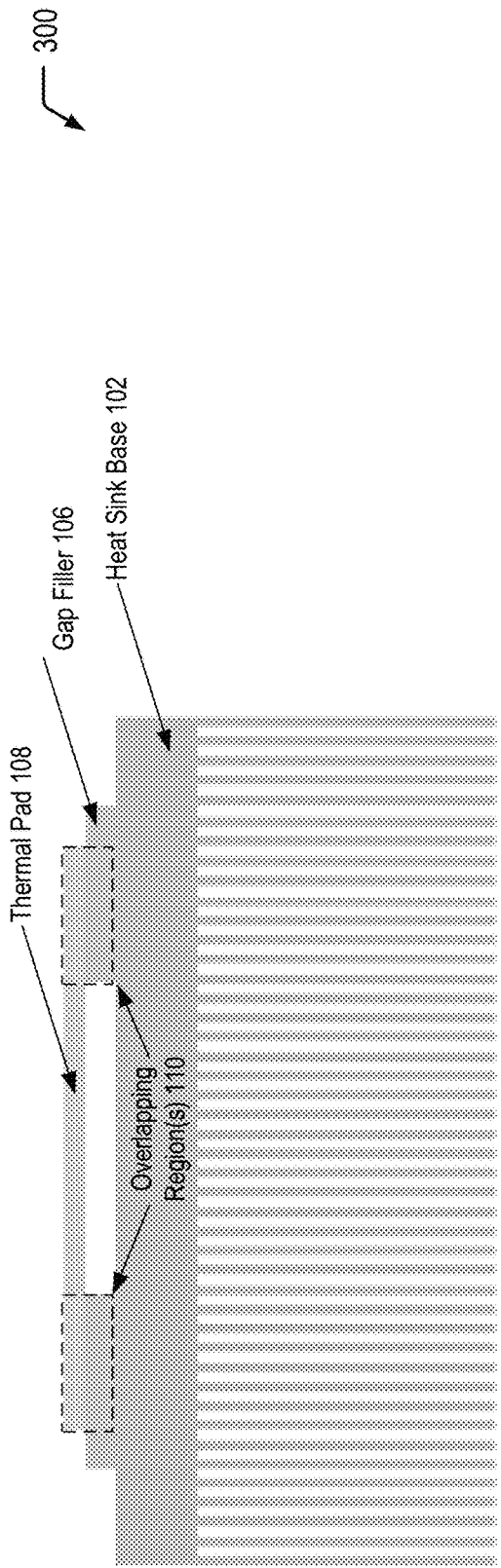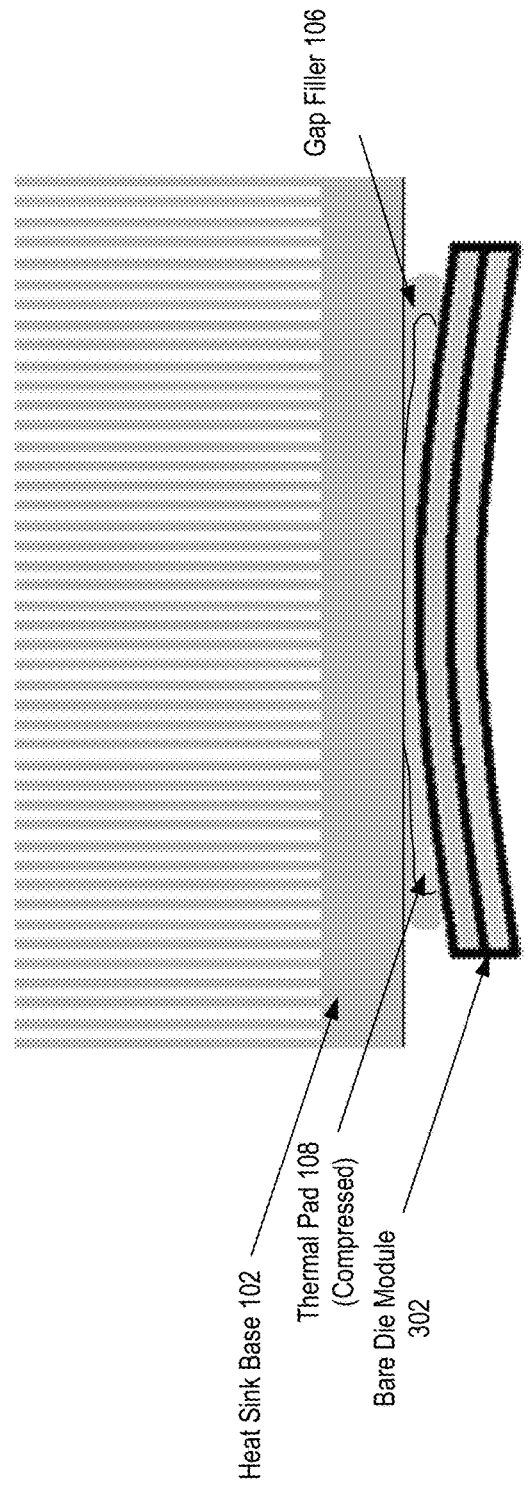
FIG. 3A
FIG. 3B

TIM Configuration(2) 502

THERMAL INTERFACE MATERIAL STRUCTURES

CROSS-REFERENCE TO RELATED APPLICATION

This application is a divisional application of and claims priority from U.S. patent application Ser. No. 15/193,186, filed Jun. 27, 2016.

BACKGROUND

Field of the Invention

The field of the invention is thermal interface materials.

Description of Related Art

Examples of thermal interface materials include thermal greases, thermal pads, and thermal gels, among numerous other materials. Thermal greases are inexpensive and provide good gap filling capability and high thermal conductivity on thin bond lines. However, short to long term grease pumping in service leads to interface voiding and thermal degradation at regions of high strain. Thermal pads provide excellent thermal conductivity, are very easy to use, and no stencil or dispense processes are required. However, thermal pads have limited compressibility and gap filling capability through a range of loading conditions. Thermal gels provide good gap filling capability and high thermal conductivity on thin bond lines. Further, the pumping phenomenon inherent to thermal greases is eliminated. However, drawbacks associated with thermal gels include the requirement of plasma cleaning of surfaces, proper cure regimens, and proper materials storage and handling to minimize potential in-service material adhesion loss and thermal degradation in high strain areas. Such tools and process controls are expensive.

SUMMARY

According to an embodiment, a thermal interface material (TIM) structure is disclosed. The TIM structure includes a first thermal interface material layer and a second thermal interface material layer. The second thermal interface material layer at least partially overlaps the first thermal interface material layer.

According to another embodiment, an apparatus includes an electronic component, a heat transfer component, and a thermal interface material structure disposed between the electronic component and the heat transfer component. The thermal interface material structure includes a first thermal interface material layer and a second thermal interface material layer that at least partially overlaps the first thermal interface material layer.

According to another embodiment, a process includes selectively applying a gap filler material to a surface of a heat transfer component to form a first thermal interface material layer. The process also includes applying a solid thermal pad to the first thermal interface material layer to form a second thermal interface material layer of a thermal interface material structure. The thermal interface material structure includes one or more overlapping regions associated with at least partial overlap of the first thermal interface material layer by the second thermal interface material layer.

The foregoing and other objects, features and advantages of the invention will be apparent from the following more particular descriptions of exemplary embodiments of the invention as illustrated in the accompanying drawings wherein like reference numbers generally represent like parts of exemplary embodiments of the invention.

BRIEF DESCRIPTION OF THE DRAWINGS

FIG. 1A is a diagram depicting an example of a thermal interface material structure that includes at least two thermal interface material layers with overlapping region(s), according to one embodiment.

FIG. 3A is a side view of an example of a thermal interface material structure that includes at least two thermal interface material layers with overlapping region(s) applied to a heat sink base, according to one embodiment.

FIG. 3B is a side view of the example thermal interface material structure of FIG. 3A after application of the heat sink to a bare die module, according to one embodiment.

DETAILED DESCRIPTION

Figure 1B:
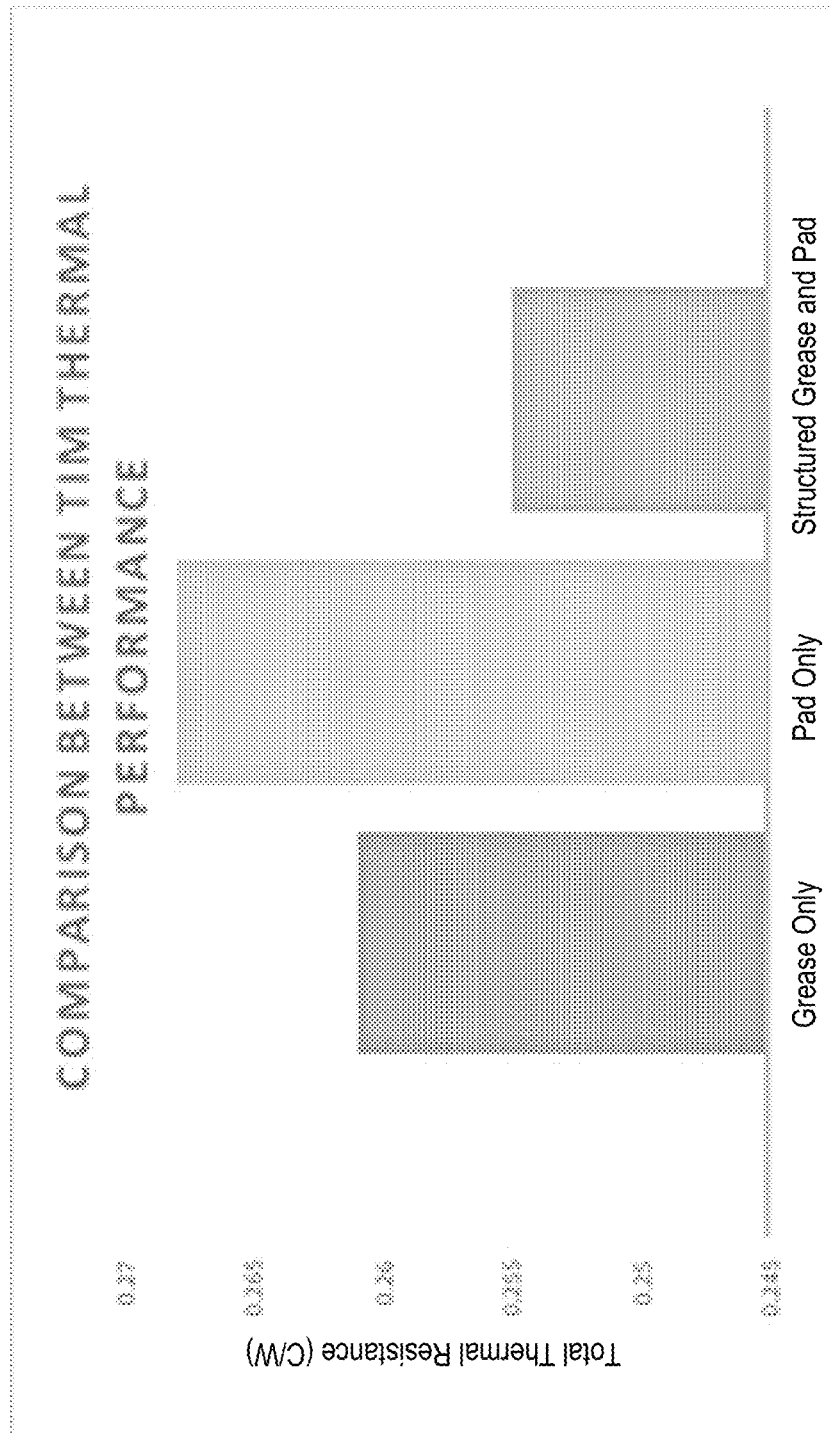
FIG. 1B is a diagram depicting an example comparison of TIM thermal performance of the TIM structure of the present disclosure to other TIM constructions.

The present disclosure describes thermal interface material (TIM) structures that utilize two (or more) compliant materials, with one or more regions of overlap between the materials. In some cases, the TIM structures of the present disclosure may be used in packaging applications where highly variable and large physical gaps are present between electronic device surfaces and heat spreading elements such as those that may be present in direct die/heatsink/spreader hardware electronic packaging.

There may be several advantages associated with the TIM structures with overlapping region(s) of the present disclosure. For example, the TIM structures of the present disclosure may mitigate or eliminate grease pumping or gel delamination potential from thin bond line regions under high-power devices. As another example, the TIM structures of the present disclosure may eliminate expensive and complex processing (no plasma needed, no cure needed). Further, the TIM structures of the present disclosure may enable easy rework, may enable field replacement for water-cooled systems (especially if gap filler pad used), may eliminate stringent die surface cleanliness requirements, and may provide significant cost reduction via process simplification. Further, the gap filler material or the thermal pad of the TIM structures of the present disclosure may also provide damping to prevent device damage. In some cases, the TIM structures of the present disclosure may be used with tertiary TIM solutions present on a common heat spreader or heat sink surface.

As an illustrative, non-limiting example, the thermal interface material structure of the present disclosure may be utilized for cooling of a high power (e.g., 300 W) graphics processing unit (GPU) card assembly possessing a complex, large, lidless 2.5D or 3-D silicon on silicon (SOS) organic laminate package that utilizes a direct heatsink attach solution. To illustrate, the SOS package may be a ball grid array (BGA) module (e.g., 55 mm) that possesses a large (e.g., 40 mm×29 mm) silicon interposer attached with C4's that also C4 interconnect multiple stacked memory silicon chip devices (HBM) and a large (e.g., 25+ mm×25+ mm) high power GPU silicon chip device encapsulated into a brick for strain relief and subsequent processing. Due to coefficient of thermal expansion (CTE) mismatch between the module carrier and the residing SOS construction, this module package may develop a considerable "bow" after being built. As such, the entire module package undergoes backside grinding of the potted SOS construction to provide a sufficiently flat device for subsequent card attachment. However, after soldering the BGA carrier to a board as part of an original equipment manufacturer (OEM) construction, considerable bow may return to the module/card assembly that develops due to similar CTE mismatch between silicon and the organic carriers in absence of substantial stiffening elements such as the module lid.

Large, out-of-flat conditions (e.g., on the order of 150-250 microns) in this packaging may be present and may create significant challenges for creating stable, high performance, reliable thermal interface constructions that can effectively make contact with the silicon device surfaces and corresponding heat spreading devices (which may also have some lesser out-of-flat surface conditions). Such large, out-of-flat conditions may create large air gaps that must be filled with thermally conductive interface material to ensure satisfactory heat extraction and efficient cooling. However, there are also regions of the interface that may develop extremely narrow thermal interface gaps, where the protruding feature of a warped convex device mates with high points on a more reasonably flat heat spreader or heat sink surface.

As described above, several thermal interface material options are available, with each having certain limitations. Although thermal grease can be coated on surfaces to fill large and variable gaps as a low cost TIM solution, these materials tend to pump away from small gap areas due to high strains that develop in the material coupled with material displacement that results from shape change in hardware associated with power cycling/aging. As a result, significant thermal degradation can arise over the life of the part from loss of TIM material at the interface due to pumping effects. In the case of the example GPU application described above, a high-power GPU device is the high spot in the construction and forms a region of a very thin grease bond line if grease is used and is therefore most subject to grease pumping. Significant thermal performance loss is also observed in these materials at thicker interface bond lines also, as incorporated high thermal conductivity particles present in the grease formulations do not come into intimate contact when the material is present within thicker interface gaps.

Multiple soft thermal gap filler materials also exist in either pad or dispensable format, but these materials are typically low thermal performance constructions that are unsuitable for cooling of a GPU device.

High performance TIM pads, such as graphite or graphite/silicone composite or soft patterned indium metal pads, also exist but have limited compliance and cannot fill large gaps (e.g., up to 150-250 microns). Some of these pads require exceedingly high loads to be effective and are unsuitable for load restrictions placed on 2.5D/3D SOS or bare die 1D silicon packages to prevent device damage. However, these materials tend to possess more consistent thermal performance throughout their range of viable bond line/gap filling capabilities.

High performance dispensable silicone or other organic elastomer material gels can also fill a large range of gaps followed by post-dispense curing to avoid pumping concerns associated with thermal grease and are used in a wide array of high performance electronic module packages. However, these materials are fragile in shipping and vibration and are subject to interfacial tearing with thermal cycling and require much processing overhead to ensure proper adhesion performance is provided to avoid tearing and good thermal interface stability/reliability. As such, implementation of these materials can be very costly as they include the need for timely cure cycles and curing ovens as well as a need to have a thoroughly clean device and heat spreader surfaces to ensure gel adhesion. This usually requires an introduction of plasma processes and associated tooling which can add significant costs to implement within individual manufacturing sites. Gel materials also require special handling and handling usage specifications as they must be kept frozen prior to use and will degrade if exposed to freeze/thaw cycles. These materials also suffer reduced thermal performance with thicker bond lines.

Dispensable or pad format phase change materials can also be good gap filling options that limit pumping phenomena found in grease, but many of these materials tend to react over time, with loss of phase change constituent and can fail for a variety of reasons. Phase change constituent can also leak from the interface with some materials sets.

Liquid metal thermal interface materials, such as Ga-based alloys, can offer solutions for high performance, highly variable TIM gap filling but are costly and come with numerous risks including material leakage and detrimental metallurgical reactions with catastrophic component failures. As such, use of liquid metals as thermal interface material options are typically avoided, and such materials are not considered generally viable or practical TIM solutions.

The previously described thermal interface material options are typically used as independent thermal interface solutions that provide a cooling path between some component or plurality of components to a heatsink or plurality of heatsinks. There are numerous examples of these types of constructions for virtually all available TIM materials sets. Further, such materials have also been used in combination with one another on a common assembly, but they are used independent of one another to cool specific components or a plurality of specific components. For example, a processor or logic control application specific integrated circuit (ASIC) device in a BGA package soldered to a card assembly may use a thermal grease as a thermal interface material between the component and heatsink surface, while other components such as memory modules assembled to the same board may use a gap filler TIM pad between these components and a heatsink surface. However, in each case, these materials are not used in overlapping combinations with each other. In contrast, the thermal interface material structures of the present disclosure include layered and/or overlapping TIM materials that combine beneficial properties for technology performance optimization and overall reliability enhancement.

The present disclosure describes a partially stacked, partially overlapped thermal interface material packaging construction that includes two (or more) different thermal interface materials. The construction includes a dispensed or stencil-screened printed thermal grease, phase change, or gel material that is preferentially applied at large gap regions in the packaging construction coupled with an overlying affixed high performance solid pad material (e.g., a compressible graphite pad, indium pad, or graphite/elastomeric composite pad) that is applied to regions where small bond line formation is desirable. This interface construction is then "sandwiched" between a common device surface and a heat spreader surface to improve performance and reliability by addressing several of the shortcomings described above. For example, the TIM structure of the present disclosure addresses problems associated with thin bond line grease pumping issues associated with single application grease solutions, thin bond line gel adhesion problems associated with single application gel solutions, and the limited gap filling capability of solid TIM pad solutions. Further, the TIM structure of the present disclosure provides improved thermal performance across an overall device area possessing substantial bow (e.g., in excess of 150 microns) that is superior to use of individually applied thermal solutions including the array of solid pad thermal interface materials or singularly dispensed or stencil applied thermal interface materials mentioned above.

Referring to FIG. 1A, a diagram 100 illustrates an example of a TIM structure that includes at least two thermal interface material layers with one or more overlapping regions, according to one embodiment. In the particular embodiment depicted in FIG. 1A, four regions of at least partial TIM material overlap are illustrated. However, it will be appreciated that an alternative number and/or arrangement of materials may be utilized that results in an alternative number and/or arrangement of areas of (at least partial) overlap.

FIG. 1A illustrates a bare die/heatsink TIM configuration that includes a heatsink base 102, a heatsink pedestal 104 (e.g., a Cu pedestal) disposed on the heatsink base 102, gap filler material 106 (e.g., thermal grease/gel), and a thermal pad 108. The thermal pad 108 partially overlies the gap filler 106 that is applied to the heatsink pedestal 104 at one or more locations, resulting in one or more overlapping regions 110. In the illustrative example of FIG. 1A, the gap filler 106 is applied at four locations on the heatsink pedestal 104, and the thermal pad 108 partially overlaps the gap filler 106 at four locations. In other cases, the gap filler 106 may be dispensed at an alternative number of locations, resulting in an alternative number of areas of overlap. Further, the degree of partial overlap depicted in the example of FIG. 1A is for illustrative purposes only and may vary. Additionally, a degree of overlap at one location may be different from a degree of overlap at another location.

Figure 2:
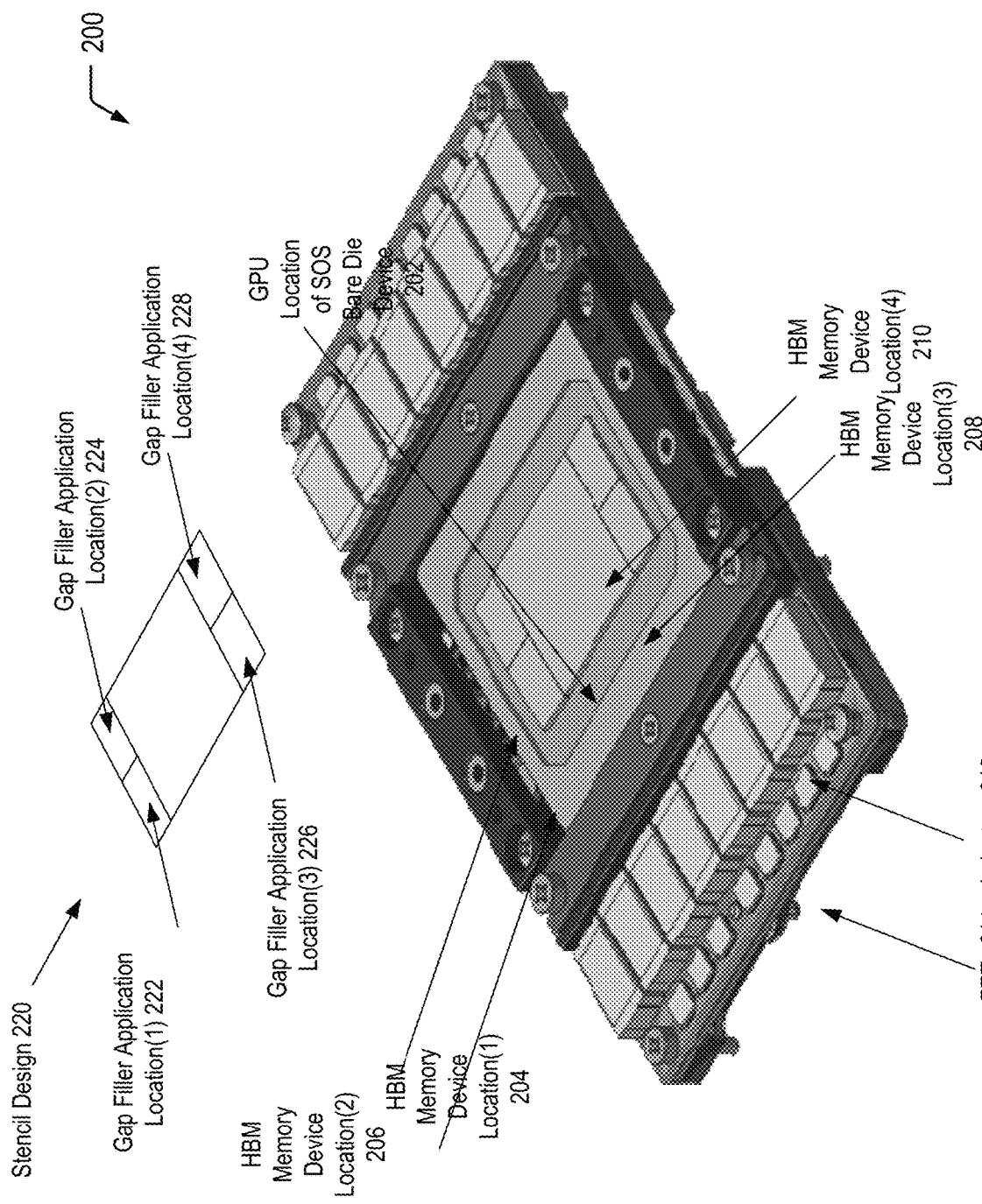
FIG. 2 is a diagram depicting an example of a stencil design that is used to identify locations of different thermal interface materials in a thermal interface structure based on locations of particular electronic components, according to one embodiment.

In some cases, as illustrated and further described herein with respect to FIG. 2, a stencil may be used to identify the regions on the heatsink pedestal 104 where the gap filler 106 is to be applied. The stencil design may vary based on the particular electronic component configuration. To illustrate, in the case of a bare die SOS module package/GPU card assembly with four HBM memory locations (as shown in the example of FIG. 2), the four locations where the gap filler 106 is applied in the example of FIG. 1A may be associated with the four HBM memory locations. It will be appreciated that alternative methods for identifying grease/gel dispensation location(s) may be used, and various methods may be utilized to apply the grease/gel to the identified location(s).

In a particular embodiment, the gap filler 106 may be a thermal grease (e.g., Shin Etsu X23-7868-2D) that is stencil printed onto the heatsink pedestal 104 (or heat spreader in the case of water-cooled systems) at corresponding HBM memory locations. Subsequent to stenciling of grease, a solid thermal pad 108 (e.g., a graphitic pad, such as Graftech HTC3200 graphite) that is cut to proper dimensions may be placed onto the heatsink at the corresponding GPU device location and may be held in position by partially overlapping the thermal pad 108 onto the stenciled gap filler 106 material to tack the thermal pad 108 in place (with the overlap regions represented in FIG. 1A by the reference character 110). In this example, the pad material is cut to a size such that, when centered on the device location, the thermal pad 108 comes in direct contact with approximately 50 percent of the stenciled gap filler material 106. In other cases, a degree of overlap may be adjusted (e.g., based on a degree of bow in the corresponding mating surfaces).

As illustrated and further described herein with respect to FIGS. 3A and 3B, subsequent to application of the overlapping TIM materials onto the heatsink base 102, the heat sink assembly is then affixed onto the electronic card assembly and put under a spring load in an assembly fixture to apply pressure to form the TIM bond lines. This assembly is then kept under pressure while spring loaded shoulder screws (e.g., 4 screws for the assembly depicted in the example of FIG. 2) are then actuated on the card/heatsink assembly to maintain a constant applied pressure on the interface after removal of the assembly load tool.

Thus, FIG. 1A illustrates an example of a TIM structure that utilizes two thermal interface materials that at least partially overlap. By using a solid TIM where gaps are small, pumping of grease or adhesion loss of gel where strains are high may be avoided, while large gap filling using grease or other dispensable material is used at outer device locations where z-direction strains are less due to the presence of thicker bond lines. As such, grease pumping or other performance loss may be reduced. In the event that performance loss is realized on outer regions, more margin for variability exists over the lower power devices. By using a highly compressible, dispensable material at outer device locations, full compressibility of the solid pad is also realized for overall performance improvement and reliability.

Because both materials are low cost and overall very easy to process, the thermal interface solution of the present disclosure is also cost effective. Presence of grease or similar compliant or elastomeric material surrounding the device bond line perimeter can also provide damping capability (e.g., under shipping/vibration conditions). Furthermore, using the overlap between stenciled/dispensed grease/gel/PCM material and the pad also provides tacking points to keep the pad in place without alignment pins which add cost and consume critical hardware real estate. Graphite pads are typically very light and fragile and, if dislodged, can undergo damage. As such, such a safe tacking and alignment method is beneficial.

Additionally, since thick bond lines associated with the use of gap fill materials typically suffer from poor thermal conductivity performance, the overlapping construction and contact with a high performance thermal pad that possesses good lateral heat spreading also provides an added conduit for heat removal at thick gap filler bond line locations. The overall improved gap filling performance of such an overlapping materials stack coupled with enhanced lateral heat flow within the pad material results in enhanced thermal interface performance improvement and outperforms single TIM solutions that employ thermal grease or thermal pads alone.

This performance improvement is generically shown in FIG. 1B as measured for a GPU device and heat spreader assembly run at approximately 200 W that possessed hardware flatness conditions requiring approximately 200 microns of gap filling capability for the thermal interface material solution. As shown in FIG. 1B, the total thermal resistance (C/W) of the structured grease and pad construction of the present disclosure is reduced with respect to both a "Grease Only" construction as well as a "Pad Only" construction. In the particular example of FIG. 1B, the total thermal resistance of the "Grease Only" construction is greater than 0.26 C/W and the total thermal resistance of the "Pad Only" construction is greater than 0.265 C/W, while the total thermal resistance of the "Structured Grease and Pad" construction of the present disclosure is less than 0.255 C/W. With respect to the data of FIG. 1B, the chart is for total thermal resistance/performance. As such, the measurements are for a GPU with affixed heat sink that was subsequently integrated into a system with air moving devices present and set to specific speeds. Overall, the chart compares the same part as built and tested with the same heat sink and same TIM1 GAP fill requirements using the three different TIM1 configurations after being integrated into the same system position, and exercised under the same set of system run conditions and system external environmental conditions.

In addition, the partially overlapping construction of the two thermal interface materials also provides redundant heat transfer paths through the combined thermal interface material sets to the device and heat spreading surfaces. The redundant thermal interface materials junctions that contact directly between the device and heat spreading surfaces through either the solid pad material, the stenciled or dispensed material, or through both materials to the respective contact surfaces can offer reliability enhancement of the thermal interface configuration. These reliability enhancements may span more consistent thermal performance through time and improved mechanical robustness of the thermal interface as well. For example, the use of thermal grease or gel materials in contact with the solid TIM pad may help prevent damage to the solid pad by damping mechanical shock and vibration events that may occur during shipment or transportation of hardware assemblies.

As further described herein, the TIM construction of the present disclosure may be used in conjunction with a tertiary TIM gap filling solution applied to a spreader for cooling of other devices such as FETs or inductors which may have independent gap filling requirements. For example, in the case of a heat spreader for water-cooled systems, a pad/grease combination may be used at corresponding GPU/HBM device locations on the spreader, while a dispensable thick gap filler TIM material (e.g., T-Putty 506 or Chromerics T636) may be used at corresponding FET and inductor locations.

Further, the attributes of the overlapping TIM construction of the present disclosure can be extended to a multiplicity of TIM materials combinations. Examples include solid metal or composite pads, coupled with stenciled or dispensed greases or gels, or combinations of partially overlapping, stacked pad materials possessing mutually compatible mechanical gap filling materials and thermal performance attributes. In addition, gap filler materials can also be used at outboard module corners to provide additional damping to ensure TIM interface integrity during shock and vibration events that may arise during handling or product shipment. Further, the gap filling material (e.g., a thermal grease material) may also improve the contact integrity of gap(s) created in the pad material associated with such shock/vibration events.

Referring to FIG. 2, a diagram 200 illustrates an example of a bare die SOS module package/GPU card assembly, according to one embodiment. FIG. 2 illustrates that, in some cases, location(s) where gap filler material is to be applied to a heatsink/heat spreader may be determined based on location(s) of one or more underlying electronic components.

In the example of FIG. 2, the bare die SOS module package/GPU card assembly includes multiple HBM memory devices locations adjacent to a GPU. In a particular embodiment, the assembly corresponds to a multi-chip SOS 2.5D or 3D SOS organic GPU/memory module package onboard assembly. The module may include a high power (e.g., 250 W to ≥270 W) GPU device surrounded by four lower power (e.g., about 8 W each) HBM stacked silicon memory devices that are affixed to a large silicon interposer that is attached to an organic module chip carrier that is BGA soldered to a board assembly possessing arrays of SMY FETs and inductors. Such cards may be used in either air-cooled or water-cooled systems where final assembly of the card includes a heat sink or heat spreader affixed to the bare die assembly with spring screws and optional non-influencing fasteners (NIFs).

In FIG. 2, a GPU location of SOS bare die device is identified by the reference character 202, and four HBM memory devices are located adjacent to the GPU location 202. A location of a first HBM memory device is identified by the reference character 204, a location of a second HBM memory device is identified by the reference character 206, a location of a third HBM memory device is identified by the reference character 208, and a location of a fourth HBM memory device is identified by the reference character 210. In the particular embodiment, the assembly further includes multiple inductors identified by the reference character 212 as well as multiple field effect transistors (FETs) identified by the reference character 214.

FIG. 2 illustrates that a stencil design 220 for application of gap filler material to a heatsink/heat spreader mating surface may be based on the associated positions of particular electronic components of the underlying assembly. In FIG. 2, the stencil design 220 is depicted above the bare die SOS module package/GPU card assembly in order to illustrate the associated positions of the underlying components on the assembly. In the example of FIG. 2, the stencil design 220 includes a first gap filler application location 222, a second gap filler application location 224, a third gap filler application location 226, and a fourth gap filler application location 228. The first gap filler application location 222 corresponds to the first HBM memory device location 204, the second gap filler application location 224 corresponds to the second HBM memory device location 206, the third gap filler application location 226 corresponds to the third HBM memory device location 208, and the fourth gap filler application location 228 corresponds to the fourth HBM memory device location 210.

In a particular embodiment, the stencil design 220 of FIG. 2 may be utilized to identify the locations where gap filler material is to be applied to a surface of a heatsink/heat spreader. To illustrate, referring to FIG. 1A, the stencil design 220 of FIG. 2 may be utilized to identify locations on a surface of the heatsink pedestal 104 where the gap filler 106 is to be applied. Specifically, the four gap filler application locations 222-228 of the stencil design 220 may correspond to the four areas depicted in FIG. 1A where the gap filler 106 is applied on the heatsink pedestal 104. After application of the gap filler 106 using the stencil design 220, the thermal pad 108 may be applied and may be held in place by the gap filler 106 at the four overlapping regions 110. As illustrated and further described herein with respect to FIGS. 3A and 3B, after application of the gap filler 106 and the thermal pad 108, the heat sink assembly may be joined to an electronic component assembly (e.g., the assembly depicted in FIG. 2), resulting in compression of the thermal pad 108 and the gap filler 106 filling the gaps that result from the "bow" in an underlying component.

While not shown in the example of FIG. 2, it will be appreciated that a stencil design may be utilized to identify various locations of an electronic component assembly where one or more thermal interface materials are to be located. To illustrate, an air-cooled heat sink or a water-cooled heat spreader may have various surfaces that are designed to "mate" with particular components on an underlying electronic assembly. For example, in some cases, gap filler material may be desirable at location(s) associated with the inductors 212 and/or location(s) associated with the FETs 214. As another example, as illustrated and further described herein with respect to FIGS. 6 and 7, gap filler material (e.g., soft gap fill pads) may be desirable at module corners (e.g., for additional damping in shipping and vibration).

Thus, FIG. 2 illustrates an example of a stencil design that is used to identify locations of different thermal interface materials in a thermal interface structure based on locations of particular electronic components.

FIGS. 3A and 3B illustrate an example of an assembly process 300 that includes forming a TIM structure on a heat dispersing surface (e.g., a heat sink base) and subsequent assembly to a bare die module, according to one embodiment. FIG. 3A is a side view of an example of a thermal interface material structure that includes at least two thermal interface material layers with overlapping region(s) applied to a heat sink base. In a particular embodiment, the assembly depicted in FIG. 3A corresponds to a side view of the TIM structure depicted in FIG. 1A. FIG. 3B is a side view of the example thermal interface material structure of FIG. 3A after application of the heat sink to a bare die module.

FIG. 3B illustrates an example of the "bow" associated with an example SOS device surface (designated as "bare die module" 302 in FIG. 3B). Specifically, a convex device profile may exist with flatness variation spanning across component HBM/GPU device areas. In some cases, the flatness variation may be 250 microns or more, with the apex of the convex, out-of-flat condition residing at the center of the GPU chip. While not shown in the example of FIGS. 3A and 3B, the heatsink pedestal may also have an out-of-flat surface profile to be taken into account for proper thermal interface gap filling. Although heat sink surfaces are typically made to a flatness of 25-50 microns, some heat spreaders may have a flatness that can range up to 100 microns. As such, a high performance, reliable thermal interface material construction may have to fill cumulative interface gaps potentially in excess of 300 microns as created by the shapes and mutual flatness profiles of module and heatsink hardware.

To create a high performance, cost effective, reliable thermal interface in complex bare die constructions (e.g., the assembly depicted in FIG. 2), a high performance compressible solid graphite pad (or equivalent composite material, phase change material, or metal pad) may be used to facilitate heat removal over the GPU. However, since the gap filling capability of high performance, high thermal conductivity pads is typically limited to a range of about 25 microns (or less) to about 125-150 microns, a dispensable or stencil-printed TIM material such as grease may be applied over the lower power memory regions that possess larger gaps to fill. A portion of the pad (or all of the pad) may be in contact with the dispensed TIM when assembled in order to provide connected thermal interface paths between the two materials. As further described herein, FIG. 1 depicts an example of such a partially overlapped/stacked TIM materials interface configuration.

FIGS. 4-7 illustrate various examples of thermal interface material structures. It will be appreciated that the example TIM configurations in FIGS. 4-7 are for illustrative purposes only and that numerous alternative TIM configurations are possible and may vary for a particular heat transfer application. Further, while FIGS. 4-7 depict two-dimensional top views of example TIM structures with overlapping region(s), it will be appreciated that a three-dimensional arrangement of particular materials at particular areas may vary.

Figure 4:
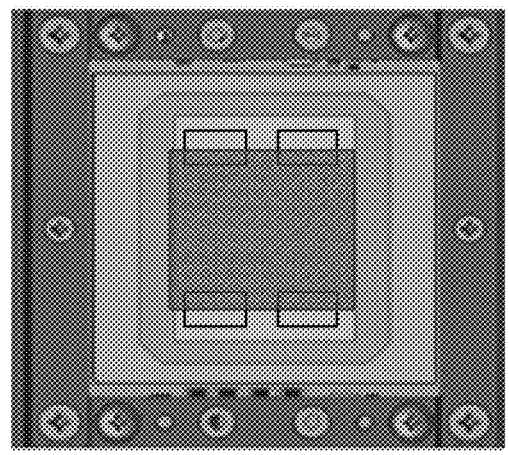
FIG. 4 is a top view of a first example of a thermal interface material structure that includes two thermal interface material layers with overlapping region(s) prior to application of the thermal interface material structure to electronic components.

FIG. 4 is a top view 400 of a first example of a thermal interface material structure that includes two thermal interface material layers with overlapping regions prior to application of the thermal interface material structure to electronic components. In the example of FIG. 4, a first TIM configuration 402 (identified as "TIM Configuration(1)") includes a solid pad and grease/gel at memory sites (similar to the TIM structure depicted in the example of FIG. 1).

Figure 5:
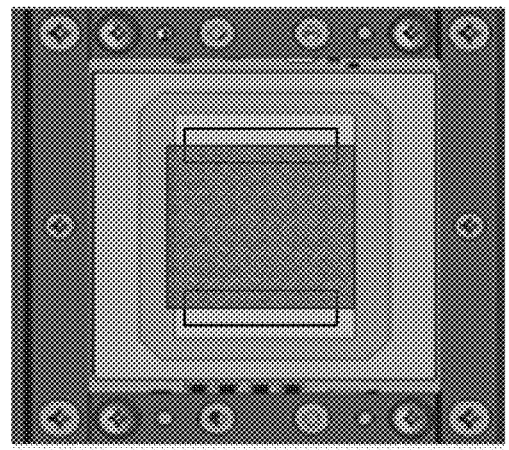
FIG. 5 is a top view of a second example of a thermal interface material structure that includes two thermal interface material layers with overlapping region(s) prior to application of the thermal interface material structure to electronic components.

FIG. 5 is a top view 500 of a second example of a thermal interface material structure that includes two thermal interface material layers with overlapping regions prior to application of the thermal interface material structure to electronic components. In the example of FIG. 5, a second TIM configuration 502 (identified as "TIM Configuration(2)") includes a solid pad and soft gap fill pads at memory sites.

Figure 6:
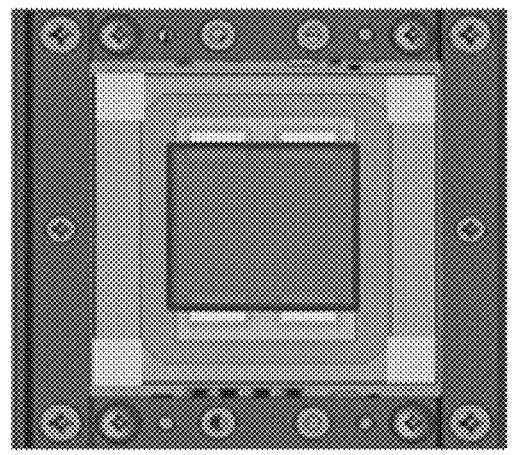
FIG. 6 is a top view of a third example of a thermal interface material structure that includes two thermal interface material layers with overlapping region(s) prior to application of the thermal interface material structure to electronic components.

FIG. 6 is a top view 600 of a third example of a thermal interface material structure that includes two thermal interface material layers with overlapping regions prior to application of the thermal interface material structure to electronic components. In the example of FIG. 6, a third TIM configuration 602 (identified as "TIM Configuration(3)") includes a solid pad and grease/gel at memory sites as well as gap fill dispense or soft gap fill pads at module corners for additional damping in shipping and vibration.

Figure 7:
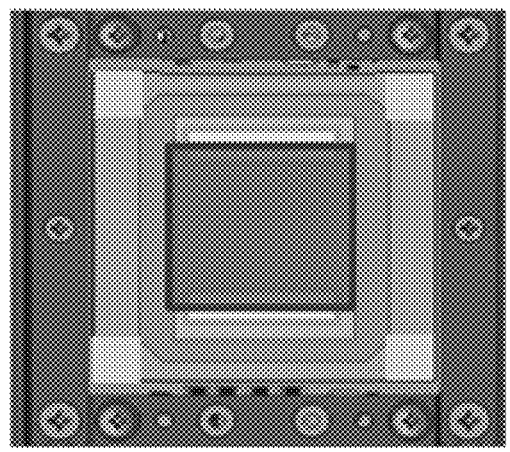
FIG. 7 is a top view of a fourth example of a thermal interface material structure that includes two thermal interface material layers with overlapping region(s) prior to application of the thermal interface material structure to electronic components.

FIG. 7 is a top view 700 of a fourth example of a thermal interface material structure that includes two thermal interface material layers with overlapping regions prior to application of the thermal interface material structure to electronic components. In the example of FIG. 7, a fourth TIM configuration 702 (identified as "TIM Configuration(4)") includes a solid pad and soft gap fill pads at memory sites as well as gap fill dispense or soft gap fill pads at module corners for additional damping in shipping and vibration.

Figure 8:
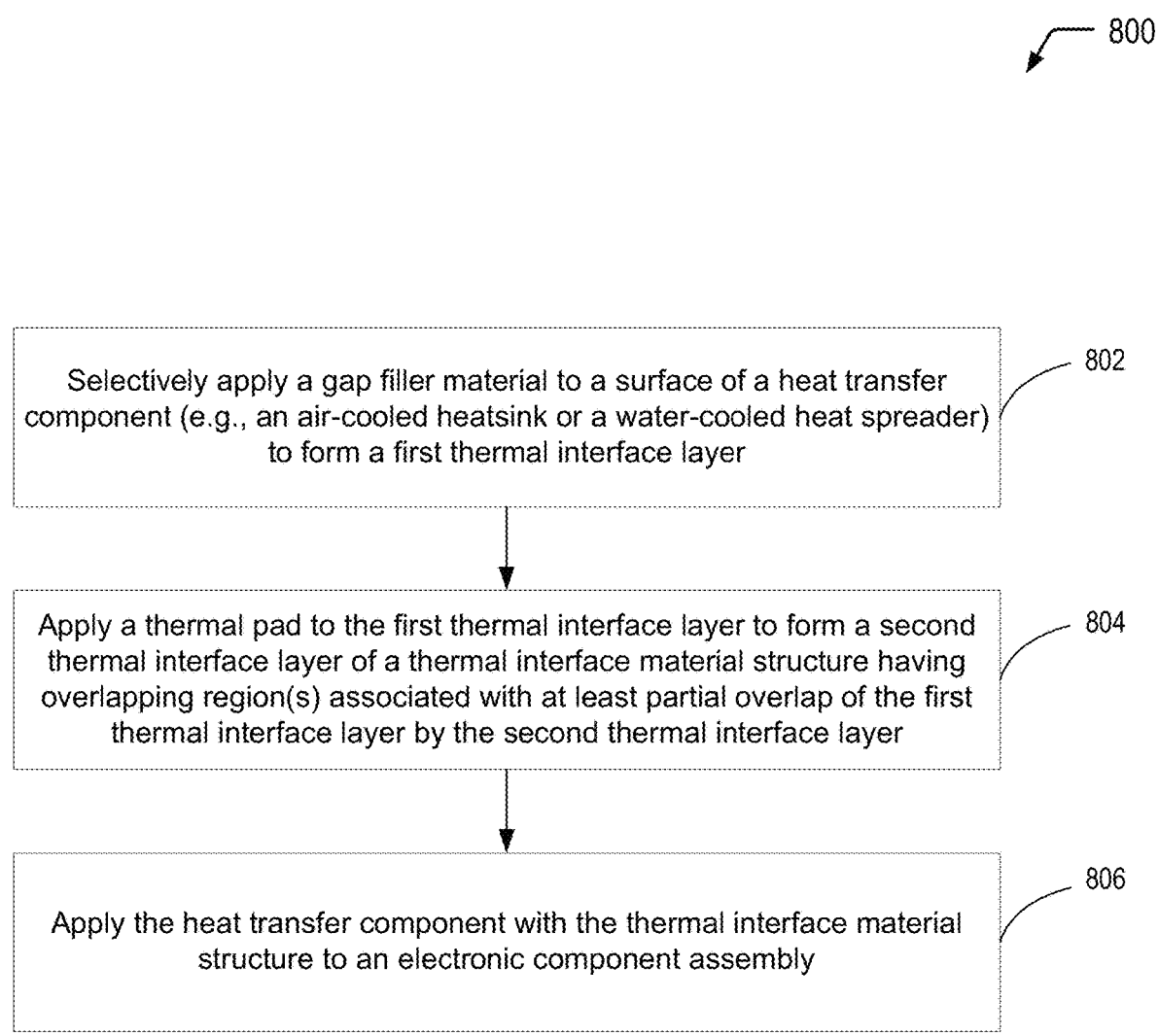
FIG. 8 is a flow diagram showing a particular embodiment of a process of forming a thermal interface material structure that includes at least two thermal interface material layers with overlapping region(s) and applying the thermal interface material structure to an electronic device.

Referring to FIG. 8, a flow diagram illustrates an example of a process 800 of forming a thermal interface material structure that includes at least two thermal interface material layers with overlapping region(s) and applying the thermal interface material structure to an electronic device, according to one embodiment. In the particular embodiment depicted in FIG. 8, the process 800 includes the application of two thermal interface material layers. In other embodiments, more than two thermal interface material layers may be utilized.

The process 800 includes selectively applying a gap filler material to a surface of a heat transfer component to form a first thermal interface layer, at 802. For example, referring to FIG. 1A, the gap filler 106 material may be applied to the heatsink pedestal 104. In the illustrative example of FIG. 1, the gap filler 106 material is applied at four locations. As illustrated and further described herein with respect to FIG. 2, the location(s) where the gap filler 106 material is to be applied may be determined based on the location(s) of corresponding mating surfaces. In the particular embodiment depicted in FIG. 2, the stencil design 220 identifies the four gap filler application locations 222-228 that correspond to the underlying HBM memory device locations 204-210. As described further herein, the heat transfer component where the gap filler material is applied may be a heatsink (e.g., for air-cooled systems) or a heat spreader (e.g., for water-cooled systems).

The process 800 includes applying a thermal pad to the first thermal interface layer to form a second thermal interface layer of a TIM structure having overlapping region(s) associated with at least partial overlap of the first TIM layer by the second TIM layer, at 804. For example, referring to FIG. 1A, the thermal pad 108 may be applied to the gap filler 106 material, resulting in the TIM structure with the four overlapping regions 110. In the illustrative example of FIG. 1A, the thermal pad 108 partially overlaps the gap filler 106 material (e.g., about 50 percent of the gap filler 106 surface area). It will be appreciated that this is for illustrative purposes only and that a degree of overlap may vary and, in some cases, may be determined based on the associated out-of-flat mating surfaces to be joined. As described further herein with respect to FIG. 2, the location where the thermal pad 108 is to be applied may be associated with a location of another underlying component of an electronic assembly (e.g., a location of a GPU).

The process 800 includes applying the heat transfer component with the TIM structure to an electronic component assembly, at 806. For example, referring to FIGS. 3A and 3B, after application of the TIM structure (e.g., to the heat sink base 102 in the example of an air-cooled heat sink), the TIM structure may be applied to the bare die module 302. Application of pressure may result in the compression of the thermal pad 108 and the gap filler 106 material spreading to fill the larger gaps at the sides of the bare die module 302 that are associated with the "bow" of the bare die module 302.

Thus, FIG. 8 illustrates an example of a process of forming a thermal interface material structure that includes at least two thermal interface material layers with overlapping region(s) and applying the thermal interface material structure to an electronic device. The overlapping region(s) may not represent "set" regions, and the gap filler material (e.g., a thermal grease material) may flow into gaps that are potentially left by the thermal pad material. The gap filler material may flow in/out depending on module warp and shock events.

It will be understood from the foregoing description that modifications and changes may be made in various embodiments of the present invention without departing from its true spirit. The descriptions in this specification are for purposes of illustration only and are not to be construed in a limiting sense. The scope of the present invention is limited only by the language of the following claims.

What is claimed is:

1. A thermal interface material (TIM) structure comprising:
a first thermal interface material layer comprising a gap filler material in contact with a heat transfer component; and
a second thermal interface material layer comprising a solid thermal pad and disposed between the first thermal interface material layer and an electronic component,
wherein the TIM structure has one or more overlapping regions associated with partial overlap of a surface of the gap filler material by the solid thermal pad such that a portion of the surface of the gap filler is exposed to a surface of the electronic component that is in contact with the solid thermal pad.

2. The TIM structure of claim 1, wherein the gap filler material includes a thermal grease material.

3. The TIM structure of claim 1, wherein the gap filler material includes a thermal gel material.

4. The TIM structure of claim 1, wherein the solid thermal pad includes a graphitic pad.

5. An apparatus comprising:
an electronic component;
a heat transfer component; and
a thermal interface material (TIM) structure disposed between the electronic component and the heat transfer component, the TIM structure including:
a first thermal interface material layer comprising a gap filler material in contact with the heat transfer component; and
a second thermal interface material layer comprising a solid thermal pad and disposed between the first thermal interface material layer and the electronic component,
wherein the TIM structure has one or more overlapping regions associated with partial overlap of a surface of the gap filler material by the solid thermal pad such that a portion of the surface of the gap filler is exposed to a surface of the electronic component that is in contact with the solid thermal pad.

6. The apparatus of claim 5, wherein the electronic component includes a bare die module.

7. The apparatus of claim 5, wherein:
the electronic component has a variable flatness profile; and
the solid thermal pad partially overlaps the surface of the gap filler material at one or more overlapping regions identified based on the variable flatness profile.

8. The apparatus of claim 7, wherein the gap filler material has a thickness that is sufficient to fill gaps between the electronic component and the heat transfer component, the gaps associated with the variable flatness profile.

9. The apparatus of claim 8, wherein the gap filler material includes a thermal grease material.

10. The apparatus of claim 8, wherein the gap filler material includes a thermal gel material.

11. The apparatus of claim 5, wherein the solid thermal pad includes a graphitic pad.

12. The apparatus of claim 5, wherein the electronic component is associated with an air-cooled computing system, and wherein the heat transfer component includes a heat sink.

13. The apparatus of claim 5, wherein the electronic component is associated with a liquid-cooled computing system, and wherein the heat transfer component includes a heat spreader.

* * * * *